United States Patent
John et al.

(10) Patent No.: US 9,612,277 B2
(45) Date of Patent: Apr. 4, 2017

(54) SYSTEM AND METHOD FOR FUNCTIONAL VERIFICATION OF MULTI-DIE 3D ICS

(71) Applicant: TAIWAN SEMICONDUCTOR MANUFACTURING CO., LTD., Hsin-Chu (TW)

(72) Inventors: Stanley John, Fremont, CA (US); Ashok Mehta, Los Gatos, CA (US); Sandeep Kumar Goel, San Jose, CA (US); Kai-Yuan Ting, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 102 days.

(21) Appl. No.: 14/595,251

(22) Filed: Jan. 13, 2015

(65) Prior Publication Data

US 2015/0123699 A1    May 7, 2015

Related U.S. Application Data

(62) Division of application No. 13/359,921, filed on Jan. 27, 2012, now Pat. No. 8,972,918.

(51) Int. Cl.
*G06F 17/50* (2006.01)
*G01R 31/28* (2006.01)
*G01R 31/3185* (2006.01)

(52) U.S. Cl.
CPC . *G01R 31/2886* (2013.01); *G01R 31/318513* (2013.01)

(58) Field of Classification Search
CPC .......................................................... G06F 17/50
USPC .......................................................... 716/136
See application file for complete search history.

(56) References Cited

U.S. PATENT DOCUMENTS

| 7,913,202 | B2 | 3/2011 | Bernstein et al. |
| 2010/0121994 | A1* | 5/2010 | Kim .................. G06F 13/1684 710/51 |
| 2012/0319717 | A1* | 12/2012 | Chi .................. G01R 31/31851 324/756.05 |

\* cited by examiner

*Primary Examiner* — Thuan Do
(74) *Attorney, Agent, or Firm* — Duane Morris LLP

(57) ABSTRACT

A system and method is disclosed for functional verification of multi-die 3D ICs. The system and method include a reusable verification environment for testing each die in a stack of dies individually without having to simultaneously operate all of the dies in the stack. The system and method includes converting an input/output ("IO") trace from a die verification test from a first format to a second format to improve performance.

20 Claims, 5 Drawing Sheets

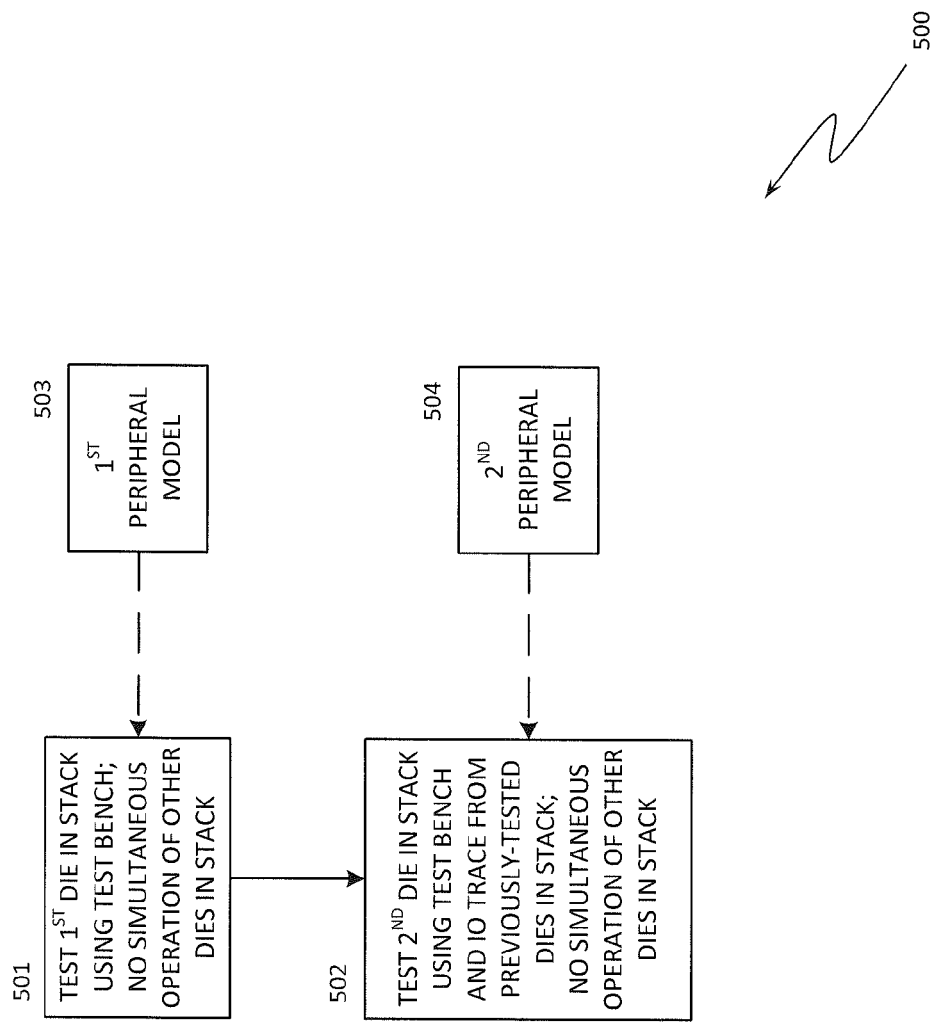

SYSTEM AND METHOD FOR FUNCTIONAL VERIFICATION OF MULTI-DIE 3D ICS

RELATED APPLICATION

This application is a division of U.S. patent application Ser. No. 13/359,921, filed Jan. 27, 2012, which is expressly incorporated by reference herein in its entirety.

BACKGROUND 3D architectures or 3D chip stacks (sometimes referred to herein as "3D stack", "3D IC", "stack of dies") encompass architectures where chips are positioned on more than one plane and may be integrated both horizontally and vertically into a single circuit, such as a system on a chip. Additionally, 3D ICs also encompass the situation where there exists more than one vertical stack of chips in the circuit. Furthermore, the chips in a 3D IC may be of different varieties, such as, but not limited to, processors, memory (of various types and capacities), digital signal processors ("DSP"), radio frequency ("RF") modules, etc., as would be familiar to those of skill in the art.

A typical current 3D IC verification methodology system is shown as system 100 in FIG. 1 which illustrates a simplified schematic diagram of a prior art 3D IC verification methodology system. Four individual dies, Die A 102, Die B 103, Die C 104, and Die D 105 are stacked in a 3D IC stack and the stack is operatively connected to a test bench 101 such that only Die A is directly connected to the test bench and each of the other dies in the stack, which are separated by inter-die interfaces 107, 108, and 109, respectively as shown, are not directly connected to the test bench. Peripheral drivers 106, as are known in the art, are also attached to the test bench 101. The interactions between Dies A through D are shown by arrows 1A, 1B, 1C, 1D, 2B, 2C, 2D, 3C, 3D, and 4D.

In order to perform functional verification of Die A 102 using the test bench 101 and the peripheral drivers 106, the interactions between all of the dies in the stack must be taken into account thereby requiring that the functionality of the 3D IC be verified as one interconnected system. Thus, verifying Die A 102 requires including the test bench 101 (and thus peripheral drivers 106) via interaction 1A, Die B via interaction 2B, Die C via interaction 2C, and Die D via interaction 2D. Similarly, verifying Die C 104 requires including the test bench 101 (and thus peripheral drivers 106) via interaction 1C, Die A via interaction 2C, Die B via interaction 3C, and die D via interaction 4D. Similar verification requirements exist for Dies B and D. Furthermore, the typical current 3D IC verification methodology is limited to verification at the signal level.

BRIEF DESCRIPTION OF THE DRAWINGS

FIG. 5 is a flow diagram of a method for functionally verifying individual chips in a 3D IC stack according to an embodiment of the present subject matter.

DETAILED DESCRIPTION

Figure 1:
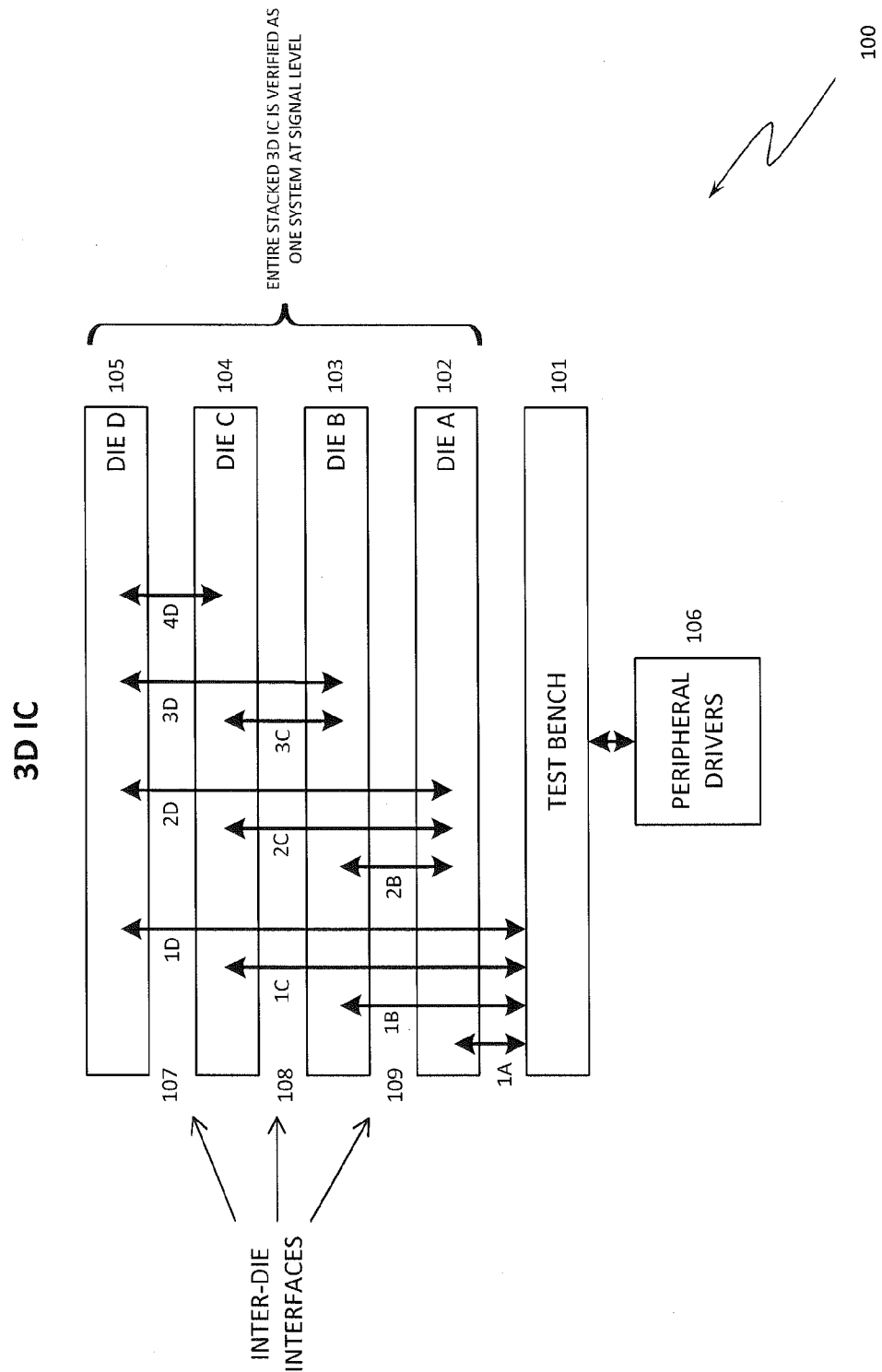
FIG. 1 is a simplified schematic diagram of a prior art 3D IC verification methodology system.

With reference to the figures where like elements have been given like numerical designations to facilitate an understanding of the present subject matter, the various embodiments of a system and method for functional verification of multi-die 3D ICs are described.

Embodiments of the present subject matter overcome the challenges associated with functional verification methods for 3D ICs and avoid the penalties that that must be paid when using traditional functional verification methods that are time consuming, labor-intensive, complex, and require an inordinate amount of resources. The present subject matter allows for incremental reuse of a die verification environment for any number of dies in a 3D stack of dies. Furthermore, embodiments of the present subject matter have the advantage that Universal Verification Methodology ("UVM") transactions allow for a clear view of functional activity at the die boundary, are easy to debug, and permit a test operator increased ability to control and/or change UVM transactions as desired. These advantages result in minimizing overall simulation and/or verification time, debugging time, and overall development time thereby providing for a shorter time to market with the attendant economic advantages.

In one embodiment, described in further detail below, a verification methodology of dies in a stack of dies includes operatively connecting a first die in the stack of dies to a test bench and to a first peripheral model; verifying the functionality of the first die to thereby produce a first input/output ("IO") trace in a first format; disconnecting the first die from the test bench; translating the first IO trace into a second format; operatively connecting a second die to the test bench and to a second peripheral model; applying the first IO trace in the second format to the test bench, and verifying the functionality of the second die. In a further embodiment, a second IO trace in the first format is produced from the verification of the second die; disconnecting the second die from the test bench; translating the second IO trace into the second format; operatively connecting a third die to the test bench and to a third peripheral model; applying the second IO trace in the second format to the test bench; and verifying the functionality of the third die.

In another embodiment, described in further detail below, for testing each die in a stack of dies where a first test procedure for each individual die in the stack requires simultaneous operation of each die in the stack, this embodiment provides an improved substitute test procedure where a first die in the stack is tested using a test bench without simultaneously operating the other dies in the stack; and testing a second die in the stack using the test bench and an IO trace produced at least in part from the testing of all previously-tested dies in the stack, where the testing of the second die is performed without simultaneously operating the other dies in the stack. In yet a further embodiment where the time required to complete the first test procedure is a second order function of the number of dies in the stack, the substitute test procedure decreases the time required for completing testing since the time required to complete the substitute test procedure is a first order function of the number of dies in the stack.

In still another embodiment, described in further detail below, a system is presented for verifying a functionality of dies arranged in a stack of dies which includes a first die in the stack of dies which is operatively connected to a test bench and operatively connected to a first peripheral model to thereby verify the functionality of the first die and to produce a first IO trace in a first format; a memory device for storing the first IO trace in the first format; a conversion unit for converting the first IO trace in the first format to a first IO trace in a second format; and a second die in the stack of dies which is operatively connected to the test bench in place of the first die and operatively connected to a second peripheral model, where the first IO trace in the second format is applied to the test bench to thereby verify a functionality of the second die. In still a further embodiment, the system further includes the memory device for storing a second IO trace in the first format where the second IO trace is produced from verifying the functionality of the second die; the conversion unit which converts the second IO trace in the first format to a second IO trace in the second format; and a third die in the stack of dies which is operatively connected to said test bench in place of said second die and operatively connected to a third peripheral model, where the second IO trace in the second format is applied to the test bench to thereby verify a functionality of the third die.

Figure 2:
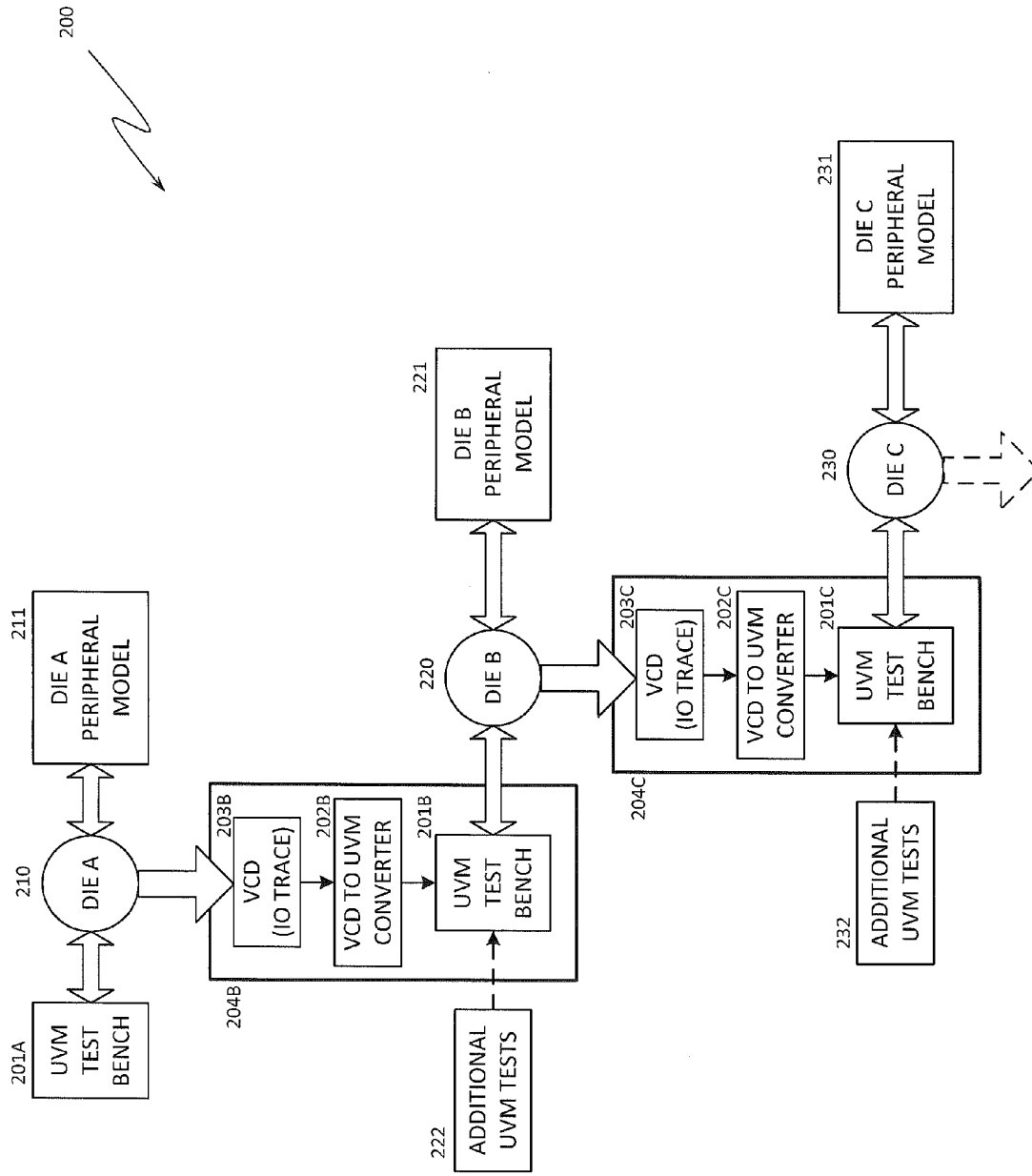
FIG. 2 is a simplified schematic diagram of a 3D IC verification methodology system according to an embodiment of the present subject matter.

With attention now directed at FIG. 2, a simplified schematic diagram of a 3D IC verification methodology system 200 according to an embodiment of the present subject matter is presented. The system 200 is used to individually verify the functionality of the dies in a stack of dies such as a 3-dimensional stack. Die A 210, which is in the stack of dies, is operatively connected to a test bench 201A, which is a UVM test bench, and Die A is also operatively connected to a peripheral model 211 for Die A. A functionality verification test is run on Die A using the test bench and the Die A peripheral model. The functional verification test of Die A produces a first IO trace in a first format which is sent to memory device 203B. The first format may be a signal level format and may be Value Change Dump ("VCD") format. The first IO trace in the first format is sent to converter 202B to change the first IO trace in the first format to a first IO trace in a second format. Alternatively, the first IO trace in the first format is sent directly to the converter 202B without being sent to memory device 203B. The second format may be a transaction level format such as Universal Verification Methodology ("UVM") format. The converter 202B may then be a VCD to UVM converter. The first IO trace in the second format is applied to the test bench 201B, which may be the same test bench as test bench 201A, for verifying the functionality of Die B 220, as described below. Together, the memory device 203B, the converter 202B, and the test bench 201B comprise a verification environment 204B which can be reused for verifying other dies in the stack of dies as discussed in further detail below.

For verifying the functionality of Die B 220, where test bench 201A and 201B are the same, Die A 210 will have been disconnected from the test bench and Die B operatively connected in its place. Die B 220 is also operatively connected to Die B peripheral model 221. A functional verification test may now be run on Die B using the first IO trace in the second format which is applied to the test bench 201B as discussed above. In an alternative embodiment for verifying the functionality of Die B, additional test input, in UVM format, may be applied by device/circuitry 222 to the test bench 201B in addition to the first IO trace in the second format being applied to the test bench.

In a further embodiment, the functional verification test of Die B 220 produces a second IO trace in the first format which is sent to memory device 203C. The first format may be a signal level format such as VCD format. Together, the memory device 203C, the converter 202C, and the test bench 201C comprise a verification environment 204C which may be the same as verification environment 204B, discussed above. The second IO trace in the first format is sent from memory device 203C to converter 202C to change the second IO trace in the first format to a second IO trace in the second format. Alternatively, the second IO trace in the first format is sent directly to the converter 202C without being sent to memory device 203C. The second format may be a transaction level format and may be UVM format. Also, the converter 202C is a VCD to UVM converter. The second IO trace in the second format is applied to the test bench 201C, which may be the same test bench as test bench 201B and test bench 201A, for verifying the functionality of Die C 230, as described below.

For verifying the functionality of Die C 230, where test bench 201C, and 201B are the same, Die B 220 will have been disconnected from the test bench and Die C operatively connected in its place. Die C 230 is also operatively connected to Die C peripheral model 231. A functional verification test may now be run on Die C using the second IO trace in the second format which is applied to the test bench 201C as discussed above. In an alternative embodiment for verifying the functionality of Die C, additional test input, in UVM format, may be applied by device/circuitry 232 to the test bench 201C in addition to the second IO trace in the second format being applied to the test bench.

The functional verification test of Die C 230 produces a third IO trace in the first format which can be applied to an additional verification environment (not shown) for performing functional verification tests of further dies in the stack of dies. Thus, the system 200 allows reuse of a verification environment, as described above, for functionality verification testing of further dies in a stack of dies. Each die being tested does not require the simultaneous operation of any other die in the stack. Furthermore, each subsequent die tested by the system 200 uses as an input an IO trace produced at least in part from the testing of all previously-tested dies in the stack.

Figure 3:
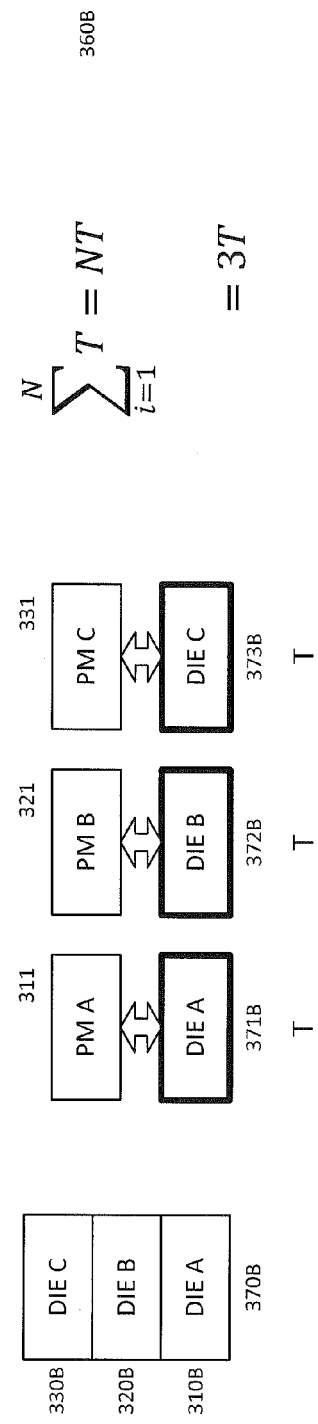
FIG. 3 is a simplified conceptual diagram of the 3D IC verification methodologies shown in FIGS. 1 and 2, indicating a comparison of the simulation time requirements for the FIG. 1 and FIG. 2 verification methodologies.

Directing attention now to FIG. 3, a simplified conceptual diagram 300 of the 3D IC verification methodologies shown in FIGS. 1 and 2 is presented, indicating a comparison of the simulation (e.g., verifying functionality test) time requirements for the FIG. 1 and FIG. 2 verification methodologies. For clarity purposes, not all of the details of the testing systems are shown (e.g., the test bench).

For the simulation time 350A using a method similar to that shown in FIG. 1, a stack of dies 370A is shown which includes three dies, Die A 310A, Die B 320A, and Die C 330A. A test of Die A is shown in the die stack 371A. Since each of the dies in the die stack 371A are interconnected, in order to test one of the dies, all the dies in the stack must be simultaneously operated. Thus, the time to complete the test of Die A is 3T where T is the simulation time for one die. Similarly, a test of Die B is shown in the die stack 372A where again the time to complete the test of Die B is 3T. Correspondingly, a test of Die C is shown in the die stack 373A where again the time to complete the test of Die C is 3T. The time to complete the testing for the dies in a stack of dies using the 350A methodology can be generally represented as equation 360A where N is the number of dies in the stack. As can be seen from equation 360A, the time to complete the testing for the die stack using the 350A methodology is a second order function of the number of dies in the die stack, N. For the die stack 370A having three dies, equation 360A results in a value of 9T as the total simulation time for die stack 370A.

For the simulation time 350B using a method similar to that shown in FIG. 2, a stack of dies 370B is shown which includes three dies, Die A 310B, Die B 320B, and Die C 330B. A test of Die A is shown in 371B where Die A is connected to peripheral model A 311 and where other details of the testing system are not shown for clarity purposes. As discussed above with respect to FIG. 2, in the 371B testing arrangement only Die A need be operated. Thus, the time to complete the test of Die A is T. Likewise, in the 372B testing arrangement for testing Die B, which is connected to peripheral model B 312, the time to complete the test of Die B is T. The same goes for testing Die C, which is connected to peripheral model C 331 in the 373B testing arrangement: the time to test Die C is T. Thus, the time to complete the testing for the dies in a stack of dies using the 350B methodology can be generally represented as equation 360B where N is the number of dies in the stack. As can be seen from equation 360B, the time to complete the testing for the die stack using the 350B methodology is a first order function of the number of dies in the die stack, N. For the die stack 370B having three dies, equation 360B results in a value of 3T as the total simulation time for die stack 370B.

Figure 4:
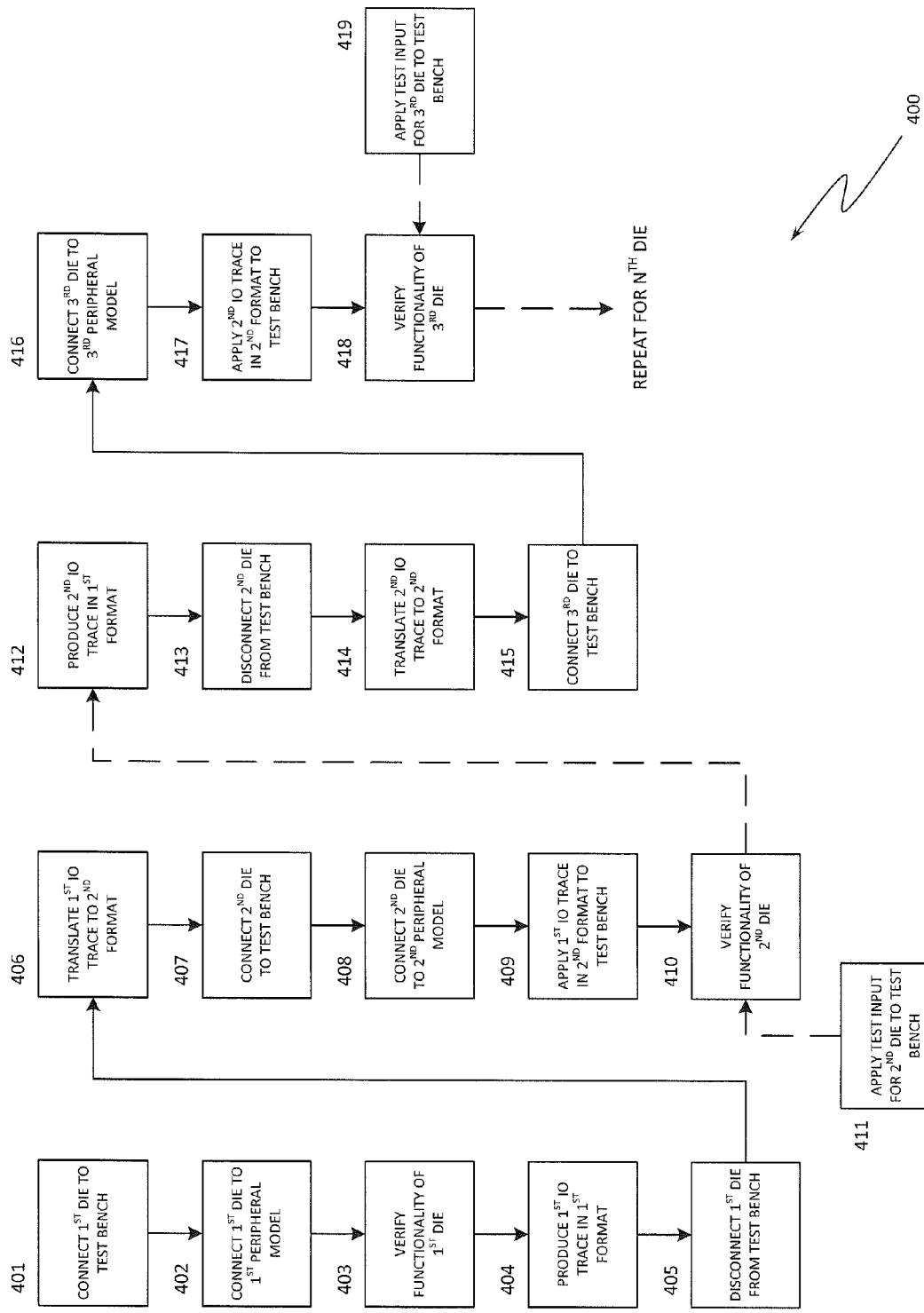
FIG. 4 is a flow diagram of methods for functionally verifying individual chips in a 3D IC stack according to embodiments of the present subject matter.

FIG. 4 is a flow diagram 400 of methods for functionally verifying individual chips in a 3D IC stack according to embodiments of the present subject matter. In an embodiment, at block 401 a first die in a stack of dies is operatively connected to a test bench, as described above. At block 402, the first die is operatively connected to a first peripheral model. At block 403, the functionality of the first die is verified which produces, at block 404, a first IO trace in a first format, as described above. At block 405, the first die is disconnected from the test bench. At block 406, the first IO trace in the first format is translated into a first IO trace in a second format, as described above. At block 407, a second die in the stack of dies is operatively connected to the test bench to which the first die was connected at block 401 and then disconnected at block 405. At block 408, the second die is operatively connected to a second peripheral model. At block 409, the first IO trace in the second format is applied to the test bench to thereby verify the functionality of the second die at block 410. Alternatively, as discussed above, at block 411 test input for the second die may be applied to the test bench which, along with the first IO trace in the second format, is used to verify the functionality of the second die at block 410.

In another embodiment, at block 410, as stated above, the functionality of the second die is verified which produces, at block 412, a second IO trace in a first format, as described above. At block 413, the second die is disconnected from the test bench. At block 414, the second IO trace in the first format is translated into a second IO trace in the second format, as described above. At block 415, a third die in the stack of dies is operatively connected to the test bench to which the second die was connected at block 407 and then disconnected at block 413. At block 416, the third die is operatively connected to a third peripheral model. At block 417, the second IO trace in the second format is applied to the test bench to thereby verify the functionality of the third die at block 418. Alternatively, as discussed above, at block 419 test input for the third die may be applied to the test bench which, along with the second IO trace in the second format, is used to verify the functionality of the third die at block 410.

In a further embodiment, the verification of the functionality of the third die at block 418 produces a third IO trace in a first format which can be used in a manner similar to that described above to verify the functionality of an $N^{th}$ die. Thus, the process can be repeated for all N dies in a stack of dies.

With reference now to FIG. 5, a flow diagram of a method 500 for functionally verifying individual chips in a 3D IC stack according to an embodiment of the present subject matter is presented. At block 501, a first die in a stack of dies is tested (e.g., verifying the functionality of the die) using a test bench where none of the other dies in the stack of dies are simultaneously operated during the testing of the first die. At block 503, a first peripheral model is operatively connected to the first die during the testing of the first die. At block 502, a second die in the stack of dies is tested using the test bench and an IO trace produced at least in part from testing of all previously-tested dies in the stack where none of the other dies in the stack of dies are simultaneously operated during the testing of the second die. At block 504, a second peripheral model is operatively connected to the second die during the testing of the second die.

As shown by the various configurations and embodiments illustrated in FIGS. 2-5, a system and method for functional verification of multi-die 3D ICs has been described.

While preferred embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A method for testing each die of a plurality of dies arranged in a stack of dies via a substitute test, comprising:
    testing a first die in the stack using a test bench external to the dies while simultaneously deactivating the other dies in the stack;
    generating an input/output ("IO") trace signal based on the testing of the first die, wherein the I/O trace signal indicates, at least part of, a functionality of the first die; and
    testing a second die in the stack using said test bench and the IO trace signal, wherein the testing of the second die is performed while simultaneously deactivating the other dies in the stack.

2. The method of claim 1 wherein the testing of the second die includes applying test input for said second die to said test bench.

3. The method of claim 1 wherein the testing of the first die in the stack includes using a first peripheral module.

4. The method of claim 3 wherein the testing of the second die in the stack includes using a second peripheral module.

5. The method of claim 1 wherein the time required to complete the first test procedure is a second order function of the number of dies in the stack, and wherein the time required to complete the substitute test procedure is a first order function of the number of dies in the stack.

6. The method of claim 1 wherein said stack of dies is a 3-dimensional stack.

7. The method of claim 1 wherein said IO trace signal is in a signal level format.

8. The method of claim 7 wherein the signal level format is a Value Change Dump ("VCD") format.

9. The method of claim 7 further comprising translating said IO trace signal from the signal level format to a transaction level format.

10. The method of claim 9 wherein the transaction level format is a Universal Verification Methodology ("UVM") format.

11. The method of claim 9 further comprising testing said second die in the stack using said IO trace signal in the transaction level format.

12. A method for testing each die of a plurality of dies arranged in a stack of dies, comprising:
   testing a first die in the stack using a test bench external to the dies while simultaneously deactivating the other dies in the stack;
   producing a first input/output ("IO") trace signal in a first format based on the testing of the first die, wherein the I/O trace signal indicates, at least part of, a functionality of the first die;
   translating said first IO trace signal in the first format to a second format; and
   testing a second die in the stack using said test bench and the first IO trace signal in the second format, wherein the testing of the second die is performed while simultaneously deactivating the other dies in the stack.

13. The method of claim 12 wherein the first format is a signal level format.

14. The method of claim 12 wherein the second format is a transaction level format.

15. The method of claim 12 further comprising:
   producing a second TO trace in said first format from testing of said second die in the stack;
   translating said second IO trace in said first format to a second 10 trace in said second format;
   testing a third die in the stack using said test bench and said second 10 trace in said second format.

16. The method of claim 15 wherein the testing of the third die in the stack includes using a third peripheral module.

17. A system for testing each die of a plurality of dies arranged in a stack of dies via a substitute test procedure, comprising:
   a test bench external to the dies configured to:
   test a first die in the stack while simultaneously deactivating the other dies in the stack;
   generating an input/output ("IO") trace signal based on the testing of the first die, wherein the I/O trace signal indicates, at least part of, a functionality of the first die; and
   test a second die in the stack using the TO trace signal, wherein the testing of the second die is performed while simultaneously deactivating the other dies in the stack.

18. The system of claim 17 wherein said IO trace signal is in a signal level format.

19. The system of claim 18 wherein the test bench is configured to translate said IO trace from the signal level format to a transaction level format.

20. The system of claim 17 wherein the time required to complete the first test procedure is a second order function of the number of dies in the stack, and wherein the time required to complete the substitute test procedure is a first order function of the number of dies in the stack.

* * * * *

UNITED STATES PATENT AND TRADEMARK OFFICE
CERTIFICATE OF CORRECTION

PATENT NO.          : 9,612,277 B2
APPLICATION NO.     : 14/595251
DATED               : April 4, 2017
INVENTOR(S)         : Stanley John et al.

Page 1 of 1

It is certified that error appears in the above-identified patent and that said Letters Patent is hereby corrected as shown below:

In the Claims

Claim 15, Column 7, Line 27, delete "TO" and insert -- IO --.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*